(12) United States Patent
Tan et al.

(10) Patent No.: US 11,387,261 B2
(45) Date of Patent: Jul. 12, 2022

(54) ARRAY SUBSTRATE AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Wen Tan, Beijing (CN); Jia Chen, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 0 days.

(21) Appl. No.: 16/191,806

(22) Filed: Nov. 15, 2018

(65) Prior Publication Data
US 2019/0305003 A1    Oct. 3, 2019

(30) Foreign Application Priority Data
Mar. 30, 2018  (CN) .......................... 201810291039.1

(51) Int. Cl.
*H01L 27/32*    (2006.01)
*H01L 27/12*    (2006.01)

(52) U.S. Cl.
CPC .......... *H01L 27/124* (2013.01); *H01L 27/127* (2013.01); *H01L 27/1288* (2013.01); *H01L 27/3276* (2013.01); *H01L 27/3279* (2013.01)

(58) Field of Classification Search
CPC .......... H01I 27/124; H01I 27/1214–127; H01I 27/3279; H01I 51/5228; H01I 51/5212;
(Continued)

(56) References Cited

U.S. PATENT DOCUMENTS

| 2003/0179329 A1 | 9/2003 | Choi |
| 2006/0125390 A1* | 6/2006 | Oh ...................... H01L 27/3276 313/506 |

(Continued)

FOREIGN PATENT DOCUMENTS

| CN | 102956672 A | 3/2013 |
| CN | 104952884 A | 9/2015 |

(Continued)

OTHER PUBLICATIONS

Second Office Action dated Jul. 27, 2020 for application No. 201810291039.1 with English translation attached.
(Continued)

*Primary Examiner* — Eric K Ashbahian
(74) *Attorney, Agent, or Firm* — Nath, Goldberg & Meyer; Joshua B. Goldberg

(57) ABSTRACT

The present disclosure provides an array substrate and a display device. The array substrate includes a display region and a non-display region located at a periphery of the display region. The display region includes a plurality of pixel structures, and an outgoing line of each of the pixel structures is overlapped with and connected to a connection line. The connection line receives a signal provided by a signal supply circuit. An area of a contact interface between at least part of the connection line and the outgoing line is larger than an area of an orthographic projection of the contact interface on a plane where the array substrate is located.

12 Claims, 3 Drawing Sheets

(58) Field of Classification Search
CPC ............... H01I 27/3258; H01I 27/1248; H01I 24/02–09; G02F 1/1345; G02F 1/13452; G02F 1/13454
See application file for complete search history.

(56) References Cited

U.S. PATENT DOCUMENTS

| | | |
|---|---|---|
| 2013/0044044 A1 | 2/2013 | Ha et al. |
| 2014/0166996 A1* | 6/2014 | Kim .................... H01L 51/5203 257/40 |
| 2015/0228927 A1* | 8/2015 | Kim .................... H01L 27/3276 257/40 |
| 2016/0293888 A1* | 10/2016 | Shim .................. H01L 27/3246 |
| 2017/0271372 A1 | 9/2017 | Go et al. |
| 2018/0039116 A1 | 2/2018 | Li |
| 2018/0197960 A1 | 7/2018 | Lv |
| 2019/0197977 A1* | 6/2019 | Wu ....................... G09G 3/3674 |
| 2019/0252479 A1* | 8/2019 | Kang .................. H01L 27/3265 |
| 2019/0305003 A1* | 10/2019 | Tan .................... H01L 51/5228 |

FOREIGN PATENT DOCUMENTS

| | | |
|---|---|---|
| CN | 105655391 A | 6/2016 |
| CN | 105895638 A | 8/2016 |
| KR | 20030020785 A | 3/2003 |
| KR | 20040110932 A | 12/2004 |

OTHER PUBLICATIONS

First Office Action dated Mar. 2, 2020, for corresponding Chinese application 201810291039.1.

* cited by examiner

ARRAY SUBSTRATE AND DISPLAY DEVICE

CROSS-REFERENCE TO RELATED APPLICATIONS

The present application claims the priority of Chinese Patent Application No. 201810291039.1, filed on Mar. 30, 2018 in the Chinese Patent Office, the contents of which are incorporated herein by reference in its entirety.

TECHNICAL FIELD

The disclosure relates to a technical field of display, in particularly, to an array substrate and a display device.

BACKGROUND

Currently emerging active-matrix organic light emitting diodes (AMOLED for short) are high-precision flat display substrates.

With the development of flexible displays with a narrow bezel, there are strict requirements for a gate driving circuit of an array substrate (referred to as Gate On Array, GOA for short) at a bezel of a flexible AMOLED panel, an open mask, shadow control, inkjet print (IJP for short) position accuracy control, vapor deposition mask accuracy, and process control due to narrowing of the border space.

SUMMARY

According to an aspect of the disclosure, an array substrate is provided, the array substrate may include: a display region, including a plurality of pixel structures; and a non-display region, located at a periphery of the display region and having an overlapping and connection region in the non-display region. An outgoing line extended from each of the pixel structures of the display region is overlapped with and connected to a connection line in the overlapping and connection region of the non-display region. An area of a contact interface of the connection line and the outgoing line is larger than an area of an orthographic projection of the contact interface on a plane where the array substrate is located.

In an embodiment, the outgoing line is made of an alloy containing magnesium and silver.

In an embodiment, in the overlapping and connection region, the connection line has a concave-convex structure that matches with a concave-convex structure of the outgoing line.

In an embodiment, an insulating layer is further disposed in the overlapping and connection region, the insulating layer has a concave-convex structure, and the connection line is located between the insulating layer and the outgoing line.

In an embodiment, the concave-convex structure of the insulating layer may include a cross-sectional shape which is at least one of separated-strip shape, a rectangle shape, a rhombus shape, and a honeycomb shape in a plane where the array substrate is located.

In an embodiment, each of the plurality of pixel structures may include a thin film transistor, the thin film transistor may include a source and a drain disposed in a same layer and a gate, and the connection line and the source are located in different layers, respectively.

In an embodiment, the connection line is formed of a same material as that of the source and the drain.

In an embodiment, the array substrate may further include a driving circuit, a passivation layer is further disposed between the driving circuit and the insulating layer, and the connection line is located above the driving circuit.

In an embodiment, an auxiliary connection line located between the connection line and the outgoing line is further disposed in the overlapping and connection region.

In an embodiment, in the overlapping and connection region, the auxiliary connection line has a concave-convex structure that matches with the concave-convex structure of the connection line.

In an embodiment, each of the pixel structures comprises an OLED device, the OLED device comprises at least an anode, a cathode, and a light emitting layer between the anode and the cathode, and the outgoing line of each of the pixel structures is extended from the cathode of the corresponding OLED device.

In an embodiment, the connection line is applied with a voltage signal with a low level provided from a signal supply circuit.

In an embodiment, the auxiliary connection line and the anode are disposed in a same layer and are formed of a same material.

In an embodiment, the auxiliary connection line has a stacked structure including indium tin oxide and silver.

According to an aspect of the disclosure, a display device may include an array substrate described above.

According to an aspect of the disclosure, a method of manufacturing the array substrate may include: forming a plurality of grooves in an insulating layer; forming the connection line on the grooves, the connection line comprising a concave-convex structure that matches with the grooves in the insulating layer; and forming the outgoing line on the connection line. The outgoing line may include a concave-convex structure that matches with the concave-convex structure of the connection line.

In an embodiment, the method may further include: forming an auxiliary connection line between the connection line and the outgoing line, the auxiliary connection line may include a concave-convex structure that matches with the concave-convex structure of the connection line and the concave-convex structure of the outgoing line.

In an embodiment, the auxiliary connection line has a stacked structure including indium tin oxide and silver, the connection line has a stacked structure in which titanium, aluminum, and titanium are sequentially stacked, and the outgoing line is made of an alloy containing magnesium and silver.

DETAILED DESCRIPTION

In order to enable those skilled in the art to better understand the technical solutions of the present disclosure, an array substrate and a display device according to the present disclosure are further described in detail below with reference to the accompanying drawings and specific embodiments.

In the present disclosure, a photolithography process refers to a process including processes of exposure, development, etching, etc. for forming a pattern by etching using photoresist, a mask, an exposure machine, or the like; a patterning process includes a photolithography process, and further includes other processes for forming a predetermined pattern, such as a printing process and an inkjet process.

The inventors of the present disclosure have carefully studied and found that as a line width of a line connected with a power supply VSS is reduced, an area of a contact interface between the line connected with the power supply VSS and a cathode is further reduced, so that the resistance cause by the overlapping and connection between the line connected with a VSS power supply and the cathode is increased, and the voltage drop of the VSS is increased, thereby resulting in nonuniform brightness of pixels and reduced display quality. Therefore, under the condition of limited border space, it is a feasible way to ensure the area of the contact interface between the line connected with the power supply VSS and the cathode as much as possible, in order to at least partly solve the above problems.

The narrow-bezel design compresses a contact area between the cathode and the connection line in an edge region, resulting in reduced display quality. In order to at least partly solve the problem described above, an array substrate is provided. In the array substrate, a contact interface between the cathode and the connection line in the edge region is designed as a concave-convex curved surface, so that a better overlapping-connection structure of narrow-bezel design is obtained, thereby ensuring the contact area between the cathode and the connection line in case of a certain line width of the connection line, reducing the contact resistance, and improving the display quality. It should be noted that the contact resistance refers to a resistance at an interface of the two conductors.

Figure 1:
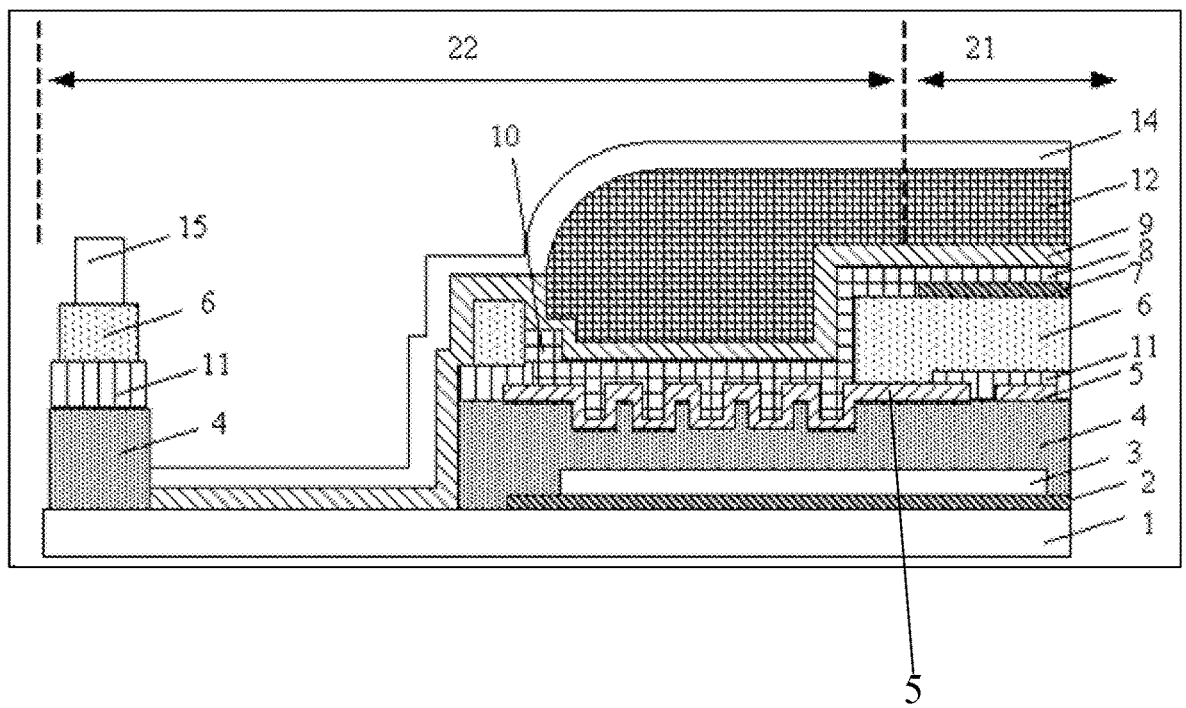
FIG. 1 is a partial schematic view of an array substrate according to an embodiment of the present disclosure.

FIG. 1 is a partial schematic view of an array substrate according to an embodiment of the present disclosure. As shown in FIG. 1, the array substrate includes a display region 21 and a non-display region 22 located at a periphery of the display region 21. The display region 21 includes a plurality of pixel structures. An outgoing line 10 of each pixel structure in an edge region of the array substrate is overlapped with and connected to a connection line 5. The connection line 5 receives a signal provided by a signal supply circuit (not shown, because it is located behind the cross-section in FIG. 1). An area of a contact interface between at least part of the connection line 5 and the outgoing line 10 is greater than an area of an orthographic projection of the contact interface on a plane where the array substrate is located. Specifically, the overlap surface of the connection line 5 and the overlap surface of the outgoing line 10 are mutually matched and curved surfaces, that is, the overlapping and connection between the connection line 5 and the outgoing line 10 of the pixel structure are designed as a concave-convex curved surface contact.

Figure 2:
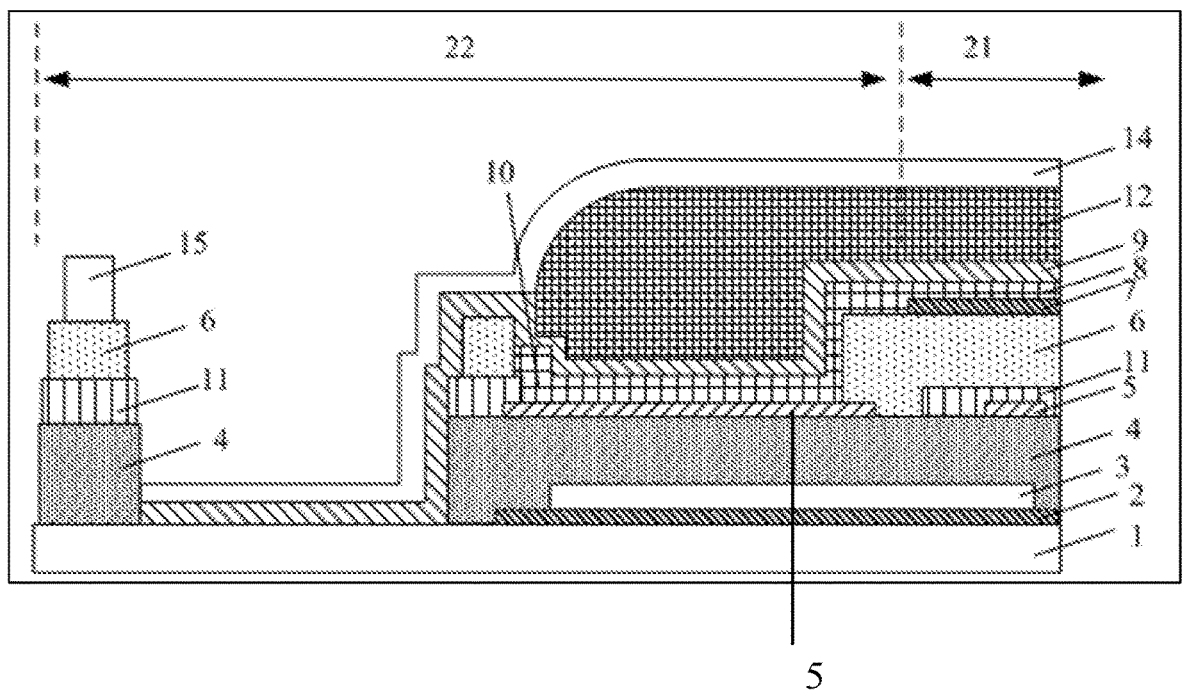
FIG. 2 is a partial schematic view of an array substrate in the related art.

Compared with an array substrate of the related art shown in FIG. 2, the overlapping and connection between the outgoing line 10 of the pixel structure and the connection line 5 are provided as the concave-convex curved surface contact in an edge region of the array substrate of the present embodiment, so that an contact area between connection line 5 and a conduct portion (i.e., the outgoing line 10) of the pixel structure in the edge region is increased, thereby ensuring the brightness of the pixel.

The pixel structure includes an OLED device including at least an anode (not shown in FIG. 1), a cathode 8 (a portion of the cathode 8 is shown in FIG. 1), and a light emitting layer 7 between the anode and the cathode 8 (a portion of the light emitting layer 7 is shown in FIG. 1). The outgoing line 10 of the pixel structure is overlapped with and connected to the connection line 5 in a region corresponding to a driving circuit 3 (for example, GOA driving circuit). The outgoing line 10 of the pixel structure is extended from the cathode 8 of the OLED device.

In an embodiment, the connection line 5 is overlapped with and connected to the outgoing line 10 in the region corresponding to the driving circuit 3. The connection line 5 is connected to a low level voltage signal supply terminal of the signal supply circuit, so that the low level voltage signal supply terminal may provide a signal of the power supply VSS to the pixel structure. The connection line 5 is located above the GOA driving circuit, which saves the lateral space required for the line connected to the power supply VSS, and realizes a narrowed border space.

In the overlapping and connection region, the connection line 5 has a concave-convex structure that matches with a concave-convex structure of the outgoing line 10, that is, the connection line 5 has the concave-convex structure in at least a portion of the region corresponding to the driving circuit 3, and the overlapping and connection between the connection line 5 and the outgoing line 10 in the non-display region 22 are provided as the concave-convex curved surface connection. Since the overlapping and connection between the connection line 5 and the outgoing line 10 in the region corresponding to the driving circuit 3 is provided as the concave-convex curved surface connection, a contact area between the outgoing line 10 and the connection line 5 in the edge region is increased and a contact resistance of the cathode 8 is reduced, thereby improving the uniformity of the low-level voltage signal supplied to the pixel structure, ensuring the brightness uniformity of the pixels, and improving the display quality.

In FIG. 1, an insulating layer 4 is further provided in the overlapping and connection region where the connection line 5 is overlapped with and connected to the outgoing line 10. Correspondingly, the insulating layer 4 has a concave-convex structure, and the connection line 5 is located on the insulating layer 4.

Figure 3A:
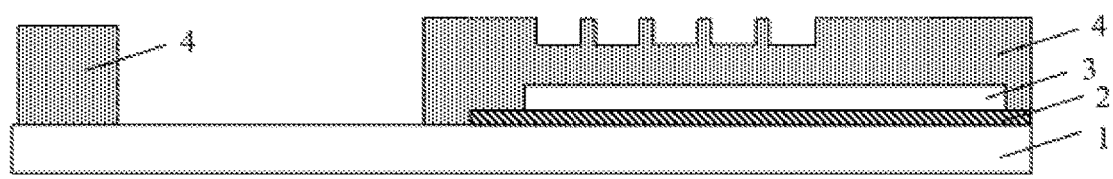
FIGS. 3A and 3B are a cross-sectional view and a plan view of an insulating layer shown in FIG. 1, respectively.
Figure 3B:
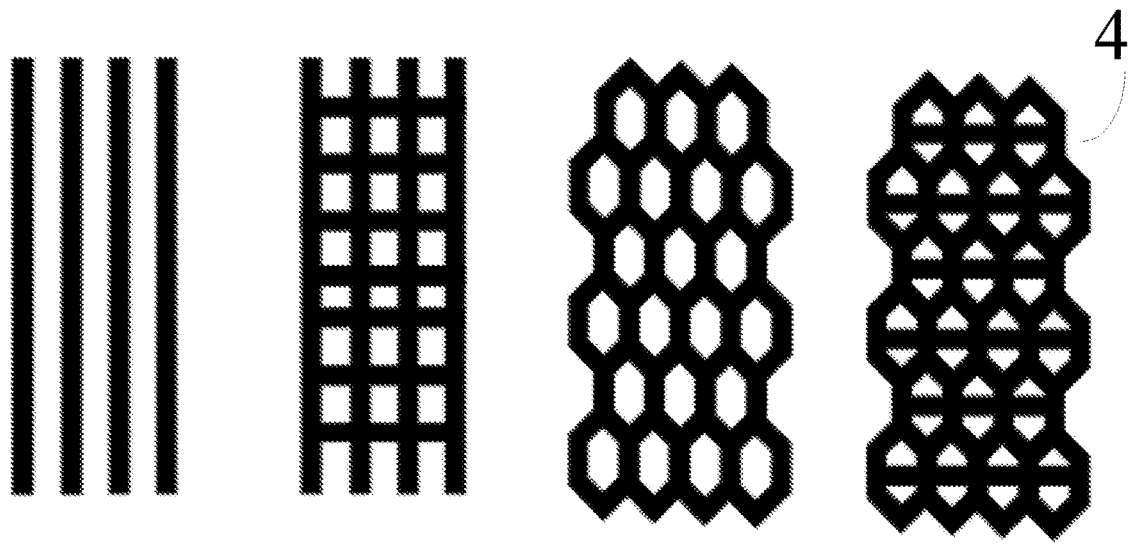

FIGS. 3A and 3B are a cross-sectional view and a plan view of the insulating layer shown in FIG. 1, respectively. As shown in FIG. 3A, since the insulating layer 4 has the concave-convex structure and the connection line 5 is located on the insulating layer 4, the connection line 5 also has a concave-convex structure, thereby realizing the overlapping and connection in a concave-convex shape between the outgoing line 10 and the connection line 5 in the edge region.

FIG. 3B shows a plan view of the insulating layer having the concave-convex structure. As shown in FIG. 3B, in a plane parallel to the plane where the array substrate is located, a cross-sectional shape of the concave-convex structure of the insulating layer 4 includes at least one of regular shapes such as separated-strip shape (for example, parallel straight lines), a rectangle shape, a rhombus shape, and a honeycomb shape, or includes other irregular shapes.

That is, in case that the insulating layer 4 has the concave-convex structure in shape of separated strips, the concave-convex structure of the connection line 5 has a shape of parallel straight lines with regard to convex portions of the insulating layer; in case that the insulating layer 4 has the concave-convex structure in shape of another regular shape such as a rectangle shape, a rhombus shape, or a honeycomb shape, the concave-convex structure of the connection line 5 may form a grid-shaped complementary pattern with regard to convex portions of the insulating layer. A various of shapes described above can increase the flexibility of configuration of the connection line 5.

In an embodiment, in the concave-convex structure, a width of each of the convex portions is equal to an interval between two adjacent convex portions, as shown in the first and second pictures in FIG. 3B.

In a manufacturing method of an array substrate, above a substrate 1, in the region where a connection line 5 is overlapped with and connected to an outgoing line 10, first, a plurality of grooves are formed in an insulating layer 4 by using a gray tone mask (GTM) or a half tone mask (HTM), the connection line 5 is formed on the grooves as a concave-convex structure, and the outgoing line 10 is formed on the connection line 5 as a concave-convex structure that is matched with the concave-convex structure of the connection line 5, so that a contact area between the outgoing line 10 and the connection line 5 in a limited space is increased. It should be noted that slopes are formed at sidewalls of the concave portions of the insulating layer 4 after an exposure process, instead of steep sidewalls that appear in a dry etch process. The risk of cracking of the outgoing line 10 can be avoided as long as a convex defect is prevented from occurring.

The pixel structure in the display region 21 includes a thin film transistor including a gate, and a source and a drain disposed in a same layer. The connection line 5 is located at a different layer from the source. The thin film transistor includes a gate, a source and a drain. For example, in a typical driving circuit, the gate of the thin film transistor receives a scan signal, and the source of the thin film transistor receives a data signal. The power supply VSS is transmitted to the cathode 8 via the connection line 5 and the outgoing line 10. The OLED device is turned on under the function of an anode voltage.

Generally, structures of the display region 21 and the non-display region 22 of the array substrate in a same layer may be formed in a same patterning process. For example, in a manufacturing process of the array substrate, the steps of the patterning process include: a step of forming an active layer; a step of forming a gate; a step of forming an interlayer dielectric layer 2 (the interlayer dielectric layer 2 also extends to the non-display region 22); a step of forming a source/drain; a step of forming an insulating layer 4 in the display region (the insulating layer 4 also extends to the non-display region 22); a step of forming a connection line 5; a step of forming an organic flat insulating layer 11; a step of forming a pixel defining layer 6; a step of forming spacers 15; a step of forming an organic film layer 9 of the OLED device; a step of forming an encapsulating layer 12; and a step of forming a protective layer 14. The driving circuit 3 in the non-display region 22 is a GOA driving circuit. The connection line 5 is located above the GOA driving circuit, and the connection line 5 is located above the layers of the source, drain and gate, and the insulating layer 4 is located between the connection line 5 and the source/drain. The driving circuit 3 is respectively connected to the gate and the source of the thin film transistor in the display region 21 via a gate line and a data line, respectively, and the power supply VSS is connected to the cathode 8 of the OLED device via the connection line 5.

In the array substrate according to the embodiment, the connection line 5 is formed of the same material as that of the source and the drain of the thin film transistor, such as at least one of molybdenum and copper. Since the connection line 5 is formed of the same material as that of the source and the drain, and the insulating layer 4 is disposed between the connection line 5 and the source/drain, a structure having two metal layers is formed in which the first metal layer may receive a data signal, and the second metal layer may receive a signal from the power supply VSS. In order to ensure the width of the connection line 5 connected to the power supply VSS, a structure having two metal layers is formed, that is, the source/drain of the thin film transistor are formed; the insulating layer 4 is formed; and the connection line 5 is formed, so as to ensure an effective contact area between the connection line 5 and the outgoing line 10 in case where the border space of the flexible narrow-frame AMOLED is further narrowed.

In an embodiment, the outgoing line 10 is made of an alloy including magnesium and silver (Mg/Ag).

In the array substrate according to the embodiment, in case where the border space is reduced by narrowing the overlapping and connection region where the connection line 5 is overlapped with and connected to the outgoing line 10, the connection line having the concave-convex structure is employed to increase the contact area between connection line and the outgoing line, thereby ensuring sufficient contact area of the cathode, achieving narrowed plane space of the border, and avoiding an influence on the contact area of the cathode, so that the uniformity of light emitted from the pixel structures is ensured, and the display quality is improved.

Figure 4:
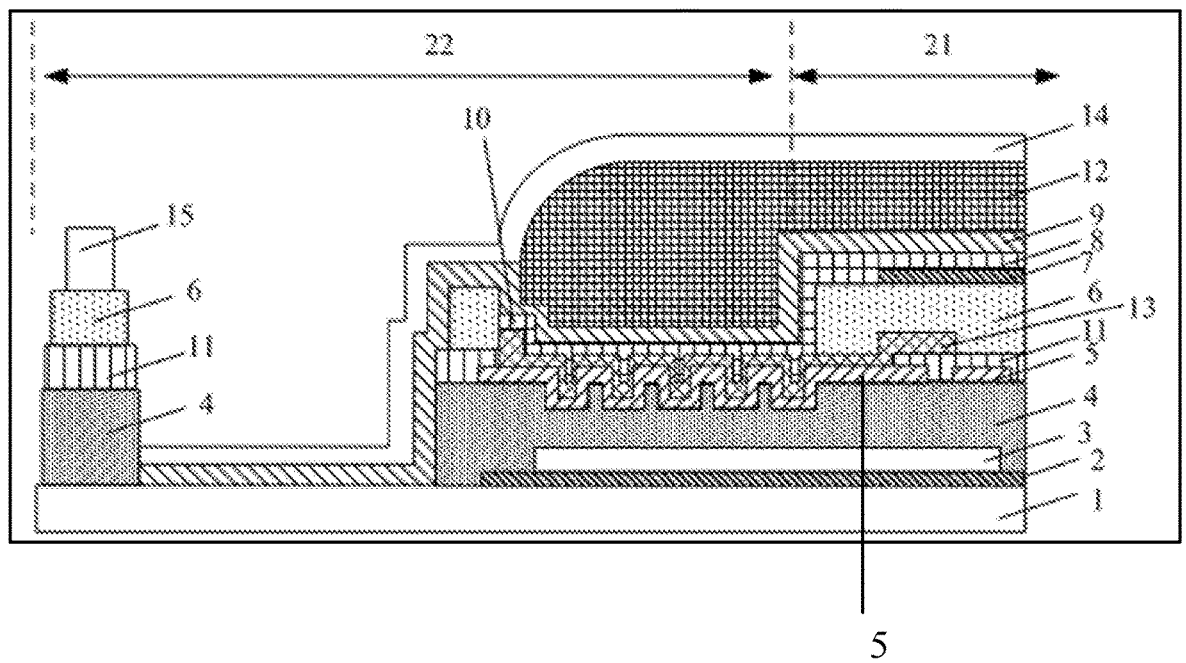
FIG. 4 is a partial schematic view of an array substrate according to an embodiment of the present disclosure.

FIG. 4 is a partial schematic view of an array substrate according to an embodiment of the present disclosure. An array substrate is provided in the embodiment of the present disclosure, a contact area between the connection line and the cathode can be ensured in case of certain widths of the connection line and the outgoing line extended from the cathode, so that the display quality can be improved.

The array substrate in the present embodiment is the same as the array substrate in the above embodiments, except that the array substrate in the present embodiment is further provided with an auxiliary connection line 13 which is disposed in the same layer as the anode and is made of the same material as that of the anode As shown in FIG. 4, the auxiliary connection line 13 between the connection line 5 and the outgoing line 10 is further provided in the region where the connection line 5 is overlapped with and connected to the outgoing line 10. The auxiliary connection line 13 is directly connected to the connection line 5. The impedance value can be further reduced by further providing the auxiliary connection line 13.

It is easy to understand that in the region where the connection line 5 is overlapped with and connected to the outgoing line 10, the auxiliary connection line 13 has a concave-convex structure that matches with the concave-convex structure of the connection line 5. Because the auxiliary connection line 13 matches the connection line 5, the impedance value can be significantly reduced to realize a better impedance reduction.

The auxiliary connection line 13 and the anode are made of the same material and may be formed in the same patterning process, without adding an additional manufacturing process.

Similarly to the above embodiments, in a manufacturing method of an array substrate, in a region where a connection line 5 is overlapped with and connected to an outgoing line 10, first, a plurality of grooves are formed in an insulating layer 4 by using a gray tone mask (GTM) or a half tone mask (HTM), the connection line 5 and an auxiliary connection line 13 are formed on the grooves as concave-convex structures, and the outgoing line 10 is formed on the auxiliary connection line 13 as a concave-convex structure that is matched with the concave-convex structure of the auxiliary connection line 13, so that a contact area between the outgoing line 10 and the auxiliary connection line 13 in a limited space is increased.

In the present embodiment, the auxiliary connection line 13 has a stacked structure including ITO (Indium Tin Oxide) and Ag, a contact resistance can be reduced by the stacked structure of the auxiliary connection line 13; the connection line 5 has a stacked structure in which titanium, aluminum and titanium (Ti/Al/Ti) are sequentially stacked, the contact resistance can be further reduced by the stacked structure of the connection line 5; and the outgoing line 10 is made of magnesium-silver (Mg/Ag) alloy. Since a contact resistance between ITO and Ti/Al/Ti is less that a contact resistance between ITO and Mg/Ag, the contact resistance between the auxiliary connection line 13 and the connection line 5 has a smaller value. Further, by means of the concave-convex structure of the insulating layer 4 at the overlapping and connection region, the overlapping and connection interface between the connection line 5 and the outgoing line 10 has a concave-convex structure, so that the contact area can be increased, and the contact resistance between the connection line 5 and the cathode 8 can be further reduced.

In the array substrate according to the embodiment, in case where the border space is reduced by narrowing the overlapping and connection region where the connection line 5 is overlapped with and connected to the outgoing line 10, the connection line 5 and the auxiliary connection line 13 each having the concave-convex structures are employed to increase the contact area between connection line and the outgoing line, thereby ensuring enough contact area between the connection line and the cathode, achieving narrowed plane space of the border, and avoiding an influence on the contact area of the cathode, so that the uniformity of light emitted from the pixel structures is ensured, and the display quality is improved.

Figure 5:
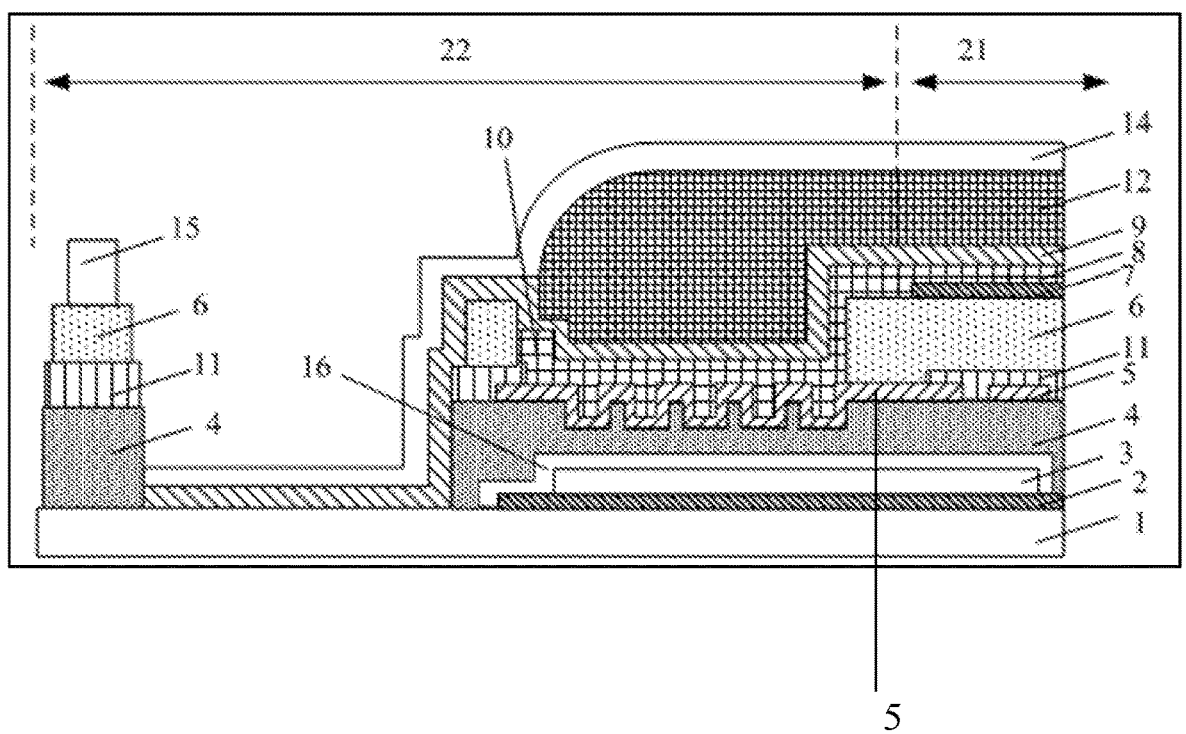
FIG. 5 is a partial schematic view of an array substrate according to an embodiment of the present disclosure.

FIG. 5 is a partial schematic view of an array substrate according to an embodiment of the present disclosure. In this embodiment, an array substrate is provided. In case where the connection line and the cathode have certain widths, a contact area between the outgoing line extended from the cathode and the connection line can be ensured, so that the brightness uniformity of the pixels is improved.

As shown in FIG. 5, the present embodiment is similar with the above embodiments, except that a first passivation layer 16 is further disposed above the driving circuit 3. The first passivation layer 16 can provide better protection for the driving circuit 3, so that the reliability is improved. It is easily understood that the first passivation layer 16 may also be disposed above the driving circuit 3 of the array substrate of the foregoing embodiments.

It is to be noted that a second passivation layer (not shown) is further disposed under the first passivation layer 16. For example, the second passivation layer is a passivation layer in the thin film transistor under the first passivation layer 16. The array substrate according to this embodiment has a narrow bezel structure with two passivation layers, thereby providing better protection for the driving circuit.

An embodiment of the present disclosure provides a display device including the array substrate of any one of the foregoing embodiments.

The display device can include any product or component with display function, such as a desktop computer, a tablet computer, a notebook computer, a mobile phone, a PDA, a GPS, a car-mounted display, a projection display, a camera, a digital camera, an electronic watch, a calculator, electronic instrument and meter, an LCD panel, electronic paper, a television, a monitor, a digital photo frame, a navigator, etc, which can be applied to many fields such as public display and unreal display.

It should be understood that the above implementations are merely exemplary embodiments for the purpose of illustrating the principles of the present disclosure, however, the present disclosure is not limited thereto. It will be apparent to those skilled in the art that various changes and modifications can be made without departing from the spirit and essence of the present disclosure, which are also to be regarded as falling within the scope of the present disclosure.

What is claimed is:

1. An array substrate, comprising:
a base substrate comprising a display region and a non-display region at a periphery of the display region,
a plurality of pixel structures in the display region; and
an outgoing line extending from each of the pixel structures in the display region, overlapping and being connected to a connection line in an overlapping and connection region of the non-display region, wherein
an area of a contact interface of the connection line and the outgoing line is larger than an area of an orthographic projection of the contact interface on the base substrate,
the array substrate further comprises an auxiliary connection line between the connection line and the outgoing line in the overlapping and connection regions;
extension directions of the auxiliary connection line, the connection line and the outgoing line are the same, and an orthographic projection of each of the auxiliary connection line, the connection line and the outgoing line overlaps an orthographic projection of each of the other two of the auxiliary connection line, the connection line and the outgoing line,
the connection line in the overlapping and connection region has a stacked structure in which titanium, aluminum, and titanium are sequentially stacked, and the connection line in the overlapping and connection region has a concave-convex structure,
the auxiliary connection is no in the overlapping and connection region has a stacked structure including indium tin oxide and silver, and the auxiliary connection line in the overlapping and connection region has a lower surface with a concave convex structure matched with the concave-convex structure of the connection line and an upper surface with a concave-convex structure,
the outgoing line is made of an alloy containing magnesium and silver, and the outgoing line has a lower surface with a concave-convex structure matched with the concave-convex structure on the upper surface of the auxiliary connection line and an upper surface which is a flat surface without concave and convex structure.

2. The array substrate according to claim 1, wherein each of the plurality of pixel structures comprises a thin film transistor, the thin film transistor comprises a source and a drain disposed in a same layer and a gate, and the connection line and the source are located in different layers, respectively.

3. The array substrate according to claim 1, wherein each of the pixel structures comprises an OLED device, the OLED device comprises at least an anode, a cathode, and a light emitting layer between the anode and the cathode, and the outgoing line of each of the pixel structures extends from the cathode of the corresponding OLED device.

4. The array substrate according to claim 3, wherein the connection line is applied with a voltage signal with a low level provided from a signal supply circuit.

5. The array substrate according to claim 3, wherein the auxiliary connection line and the anode are disposed in a same layer and are formed of a same material.

6. A display device, comprising an array substrate, which is the array substrate according to claim 1.

7. The array substrate according to claim 1, wherein the array substrate further comprises a driving circuit configured to drive a thin film transistor of the pixel structure in the display region, and an orthographic projection of the connection line on the base substrate overlaps an orthographic projection of the driving circuit on the base substrate.

8. The array substrate according to claim 1, wherein an insulating layer is further disposed in the overlapping and connection region, the insulating layer has a concave-convex structure, and the connection line is located between the insulating layer and the outgoing line.

9. The array substrate according to claim 8, wherein the concave-convex structure of the insulating layer has a portion in a straight-line shape and a portion in a honeycomb shape in a top view, and the portion in the straight-line shape intersects two parallel sides of the portion in the honeycomb shape.

10. The array substrate according to claim 8, further comprising:

a driving circuit configured to drive thin film transistors of the pixel structures in the display region, and a passivation layer between the driving circuit and the insulating layer.

11. A method of manufacturing an array substrate, comprising:

preparing a base substrate comprising a display region and a non-display region at a periphery of the display region;

forming a plurality of pixel structures in the display region;

forming a driving circuit on the base substrate, the driving circuit being configured to drive a thin film transistor of the pixel structure in the display region;

forming an insulating layer on a side of the driving circuit distal to the base substrate such that the insulating layer has a concave-convex structure;

forming an outgoing line on a side of the insulating layer distal to the base substrate, such that the outgoing line extends from each of the pixel structures in the display region, and overlaps and is connected to a connection line in an overlapping and connection region of the non-display region, wherein an area of a contact interface of the connection line and the outgoing line is larger than an area of an orthographic projection of the contact interface on the base substrate, the method further comprises forming an auxiliary connection line between the connection line and the outgoing line in the overlapping and connection regions, such that extension directions of the auxiliary connection line, the connection line and the outgoing line are the same, and an orthographic projection of each of the auxiliary connection line, the connection line and the outgoing line overlaps an orthographic projection of each of the other two of the auxiliary connection line, the connection line and the outgoing line, the auxiliary connection line in the overlapping and connection region has a stacked structure including indium tin oxide and silver, the connection line in the overlapping and connection region has a stacked structure in which titanium, aluminum, and titanium are sequentially stacked, the outgoing line is made of an alloy containing magnesium and silver, and the connection line is formed on a side of the insulating layer distal to the base substrate, such that the connection line in the overlapping and connection region has a concave-convex structure, and the auxiliary connection line is formed such that the auxiliary connection line in the overlapping and connection region has a lower surface with a concave-convex structure matched with the concave-convex structure of the connection line and an upper surface with a concave-convex structure, the outgoing line is formed on a side of the auxiliary connection line distal to the base substrate, such that the outgoing line has a lower surface with a concave-convex structure matched with the concave eons ex structure on the upper surface of the auxiliary connection line and an upper surface which is a flat surface without concave and convex structure.

12. The method according to claim 11, wherein an orthographic projection of the connection line on the base substrate overlaps an orthographic projection of the driving circuit on the base substrate.

* * * * *